United States Patent [19]

Wilkinson

[11] 4,383,210
[45] May 10, 1983

[54] APPARATUS AND METHOD FOR RECHARGING AN ENERGY STORAGE DEVICE

[76] Inventor: Rudolph P. Wilkinson, 623 Frensley, Ardmore, Okla. 73401

[21] Appl. No.: 160,909

[22] Filed: Jun. 18, 1980

[51] Int. Cl.³ .................... B65G 11/00; H02J 7/00
[52] U.S. Cl. .................................... 320/2; 194/1 M; 194/11; 320/44
[58] Field of Search ............... 194/1 M, 11, 1 N; 320/43, 44, 45, 48, 2–5; 180/65 R

[56] References Cited

U.S. PATENT DOCUMENTS

| | | | |
|---|---|---|---|
| 735,505 | 8/1903 | Haskins | 320/2 X |
| 3,105,929 | 10/1963 | Blue | 320/2 |
| 3,273,038 | 9/1966 | Miller | 320/2 |
| 3,529,229 | 9/1970 | Kennedy | 320/2 |
| 3,904,947 | 9/1975 | Crews | 320/2 |
| 4,052,655 | 10/1977 | Vizza | 320/2 |

*Primary Examiner*—R. J. Hickey
*Attorney, Agent, or Firm*—E. Harrison Gilbert, III

[57] ABSTRACT

An apparatus for providing a device with a prepurchased, selectable quantity of power from a primary power source includes a mechanism for receiving a medium of exchange, such as a money receiving mechanism. The apparatus further includes an outlet for coupling the device to the apparatus and for switchably connecting the device to a primary power source. The apparatus further includes an electronic computer which responds to the medium of exchange receiving mechanism to control the outlet so that the appropriate amount of prepurchased power is provided to the device connected thereto. The computer disconnects the electrical connection between the outlet and the primary power source when current passing through the outlet is detected by a current monitoring mechanism and the computer to be not greater than a predetermined level and voltage in the outlet is detected by a voltage monitoring mechanism and the computer to be greater than a predetermined value because these concurrently detected conditions indicate a possible power theft is in progress. The apparatus further includes a starting mechanism which initially energizes the apparatus and starts a time period running within which an appropriate medium of exchange must be received for the purchase of a selectable quantity of power to prevent the computer from deenergizing the apparatus when the time period expires.

17 Claims, 6 Drawing Figures

APPARATUS AND METHOD FOR RECHARGING AN ENERGY STORAGE DEVICE

BACKGROUND OF THE INVENTION

This invention relates generally to apparatus and methods for providing electric power to a device and more particularly, but not by way of limitation, to apparatus and methods for recharging batteries in electric vehicles.

With the diminishing amounts of petroleum and the increasing price therefor, the need for electric vehicles has increased. Just as gasoline-powered vehicles need to be refueled, electrically powered vehicles must be periodically reenergized. To reenergize an electric vehicle, electric power must be provided to recharge the energy storage device or devices contained within the vehicle. Therefore, as the need for electric vehicles has increased, the need for apparatus and methods by which the electric vehicles can be recharged has increased.

So that recharging can be conveniently performed, it is desirable that such recharging apparatus and methods be operable in response to the receipt of some medium of exchange, such as coins or similar tokens, so that a selectable quantity of power can be purchased to recharge the vehicle. So that such apparatus and methods can be economically used, it is also desirable that they function over extended periods of time without being supervised by the electric vehicle driver or other person.

If these apparatus and methods are to operate without human supervision, it is necessary that they further include the feature of detecting when a power theft is attempted. That is, it is desirable that such apparatus and methods detect an interruption in the dispensing of power thereby and cease dispensing additional power after the interruption unless an additional amount of the medium of exchange is received. Because an interruption in the dispensing of power may occur from a natural cause, such as a storm, the apparatus and methods must include features which permit them to distinguish between conditions indicating this type of interruption and conditions indicating an interruption possibly caused by a potential power thief.

To further facilitate non-human supervised operation, such apparatus and methods should detect when operation is not needed (e.g., when no power for recharging a vehicle has been purchased) and cease operating in response thereto to conserve energy.

To further make such apparatus and methods convenient to use, it is desirable that the apparatus be relatively small so that it can be located at individual vehicle parking spaces. To achieve this relatively small size, and yet retain the previously described features, it is desirable that the apparatus include and electronic computer for controlling the operation of the recharging apparatus.

Although there have been other proposals for dispensing electric power to storage devices, and in particular to storage devices in electric vehicles, I do not believe that any devices or proposals known to me disclose or suggest an apparatus and method having these previously described features and constructed in accordance with the present invention as subsequently described hereinbelow.

SUMMARY OF THE INVENTION

The present invention overcomes the above-noted and other shortcomings of the prior art by providing a novel and improved apparatus and method for recharging an energy storage device from a primary power source with a selectable quantity of power. The apparatus of the present invention includes an electronic computer and is constructed so that it can be installed at individual vehicle parking spaces to permit convenient use by an electric vehicle user. Furthermore, the present invention is responsive to the receipt of an appropriate medium of exchange, such as coins or other tokens, so that selectable quantities of power can be purchased prior to the dispensing thereof by the apparatus.

Furthermore, the present invention operates without human supervision and detects conditions which indicate a power theft attempt and turns the system off in response thereto. The present invention also distinguishes between the conditions indicating an attempted power theft and conditions indicating that a primary power outage has occurred, such as during a storm.

The present invention automatically ceases operating when it does not receive the appropriate medium of exchange within a predetermined time period.

Broadly, the present invention provides an apparatus from which a selectable quantity of electrical power can be purchased for recharging an energy storage device from a primary power source. This apparatus includes activation means for selecting a quantity of power to be delivered from the primary power source to the storage device. The apparatus further includes outlet means, switchably connected to the primary source, for electrically connecting the apparatus and the storage device. For controlling the switchable connection of the outlet means with the primary power source, the present invention further includes electronic control means which is responsive to the activation means.

More particularly, the activation means includes receiving means for receiving a predetermined medium of exchange, such as a coin or other currency, so that a predetermined quantity of power to be delivered to the storage device is purchased when an appropriate medium of exchange is received by the receiving means. The activation means further includes start means for energizing the electronic control means prior to depositing the appropriate medium of exchange in the receiving means.

The electronic control means includes means, responsive to the receiving means, for making the switchable connection of the outlet means with the primary power source so that the purchased predetermined quantity of power is delivered to the storage device when the storage device is connected to the outlet means. The electronic control means further includes current monitoring means for determining the amount of current passing through the outlet means during a predetermined time period and current stopping means, responsive to the current monitoring means, for disconnecting the switchable connection between the outlet means and the primary power source when the current monitoring means determines the current flowing through the outlet means during the predetermined time period is not greater than, or, in other words, is less than or equal to, a predetermined value. The electronic control means further includes voltage monitoring means for detecting a voltage level in the outlet means, and current passing means, responsive to the voltage monitoring means, for preventing the current stopping means from disconnecting the switchable connection if the detected voltage level is not greater than a predetermined level. Therefore, when both the voltage and current associated with the outlet means are less than or equal to the respective predetermined levels, no disconnection of the outlet means from the primary power source occurs because such an occurrence indicates a loss in power arising from a storm, for example, as opposed to an attempted power theft.

Furthermore, the electronic control means includes means for determining the difference between the predetermined quantity of power purchased and the quantity of power delivered to the storage device connected to the outlet. For displaying the difference, the apparatus of the present invention also comprises display means.

The electronic control means also includes means for deenergizing the electronic control means when no quantity of power is selected, or purchased, within a predetermined time period after the start means of the activation means energizes the electronic control means.

From the foregoing it is a general object of the present invention to provide a novel and improved apparatus and method for recharging an energy storage device from a primary power source. Other and further objects, features, and advantages of the present invention will be readily apparent to those skilled in the art when the following description of the preferred embodiment is read in conjunction with the accompanying drawings.

BRIEF DESCRIPTION OF THE DRAWINGS

FIGS. 5A and 5B are a flow chart of a preferred embodiment program for controlling the operation of the present invention.

DETAILED DESCRIPTION OF A PREFERRED EMBODIMENT OF THE INVENTION

With reference to the drawings a preferred embodiment of the apparatus constructed in accordance with the present invention will be described. The recharging apparatus is generally referred to by the reference numeral 2. In the FIG. 1 embodiment the apparatus 2 is shown mounted on a first arm 4 of a support structure 6 adjacent an ordinary parking meter 8 which is positioned on a second arm 10 of the support 6. The apparatus 2 includes a housing 12 and outlet means 14. Passing upward through the support structure 6 to the outlet means 14 are power lines 16 and 18 extending from a primary power source (not shown), such as the municipal source of electrical power.

Figure 1:
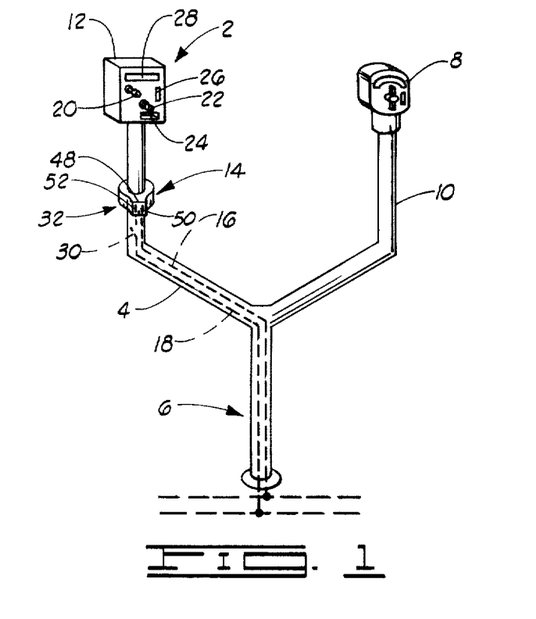
FIG. 1 is a schematic elevation illustration of the present invention mounted adjacent an ordinary parking meter.

As shown in FIG. 1 the housing 12 has a manual start button 20, a coin return button 22, a coin return slot 24, a coin insertion slot 26, and a visual display element 28 associated with the exterior thereof.

The outlet means 14 is shown in FIG. 1 to include a switch means 30 and an interfacing means 32 for electrically coupling the apparatus 2 to a device for receiving the quantity of power to be dispensed by the present invention. An example of a device for receiving the dispensed power is an electric vehicle 34, illustrated in FIG. 4, having storage batteries which can be recharged with the dispensed power.

Figure 2:
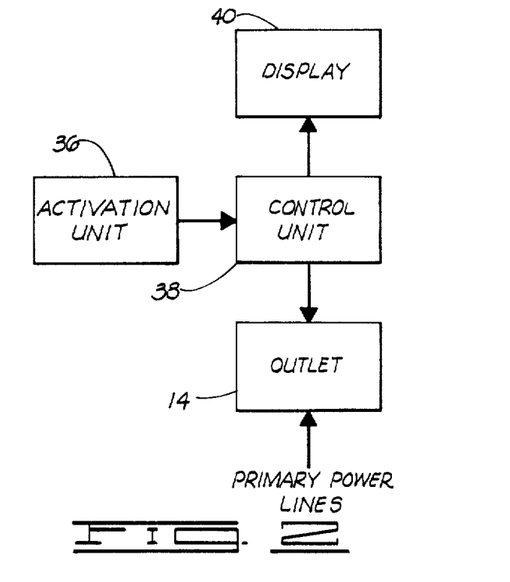
FIG. 2 is a block diagram of the functional elements of the present invention.
Figure 3:
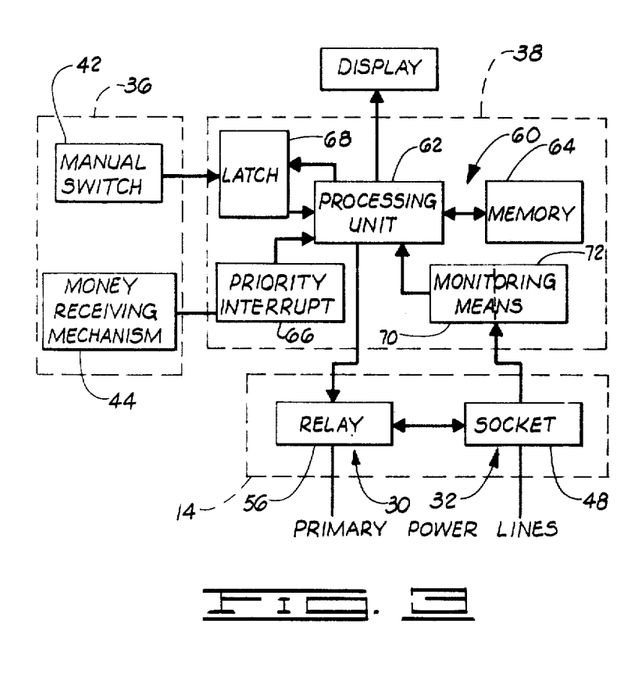
FIG. 3 is a block diagram of a preferred embodiment of the system disclosed in FIG. 2.
Figure 3A:
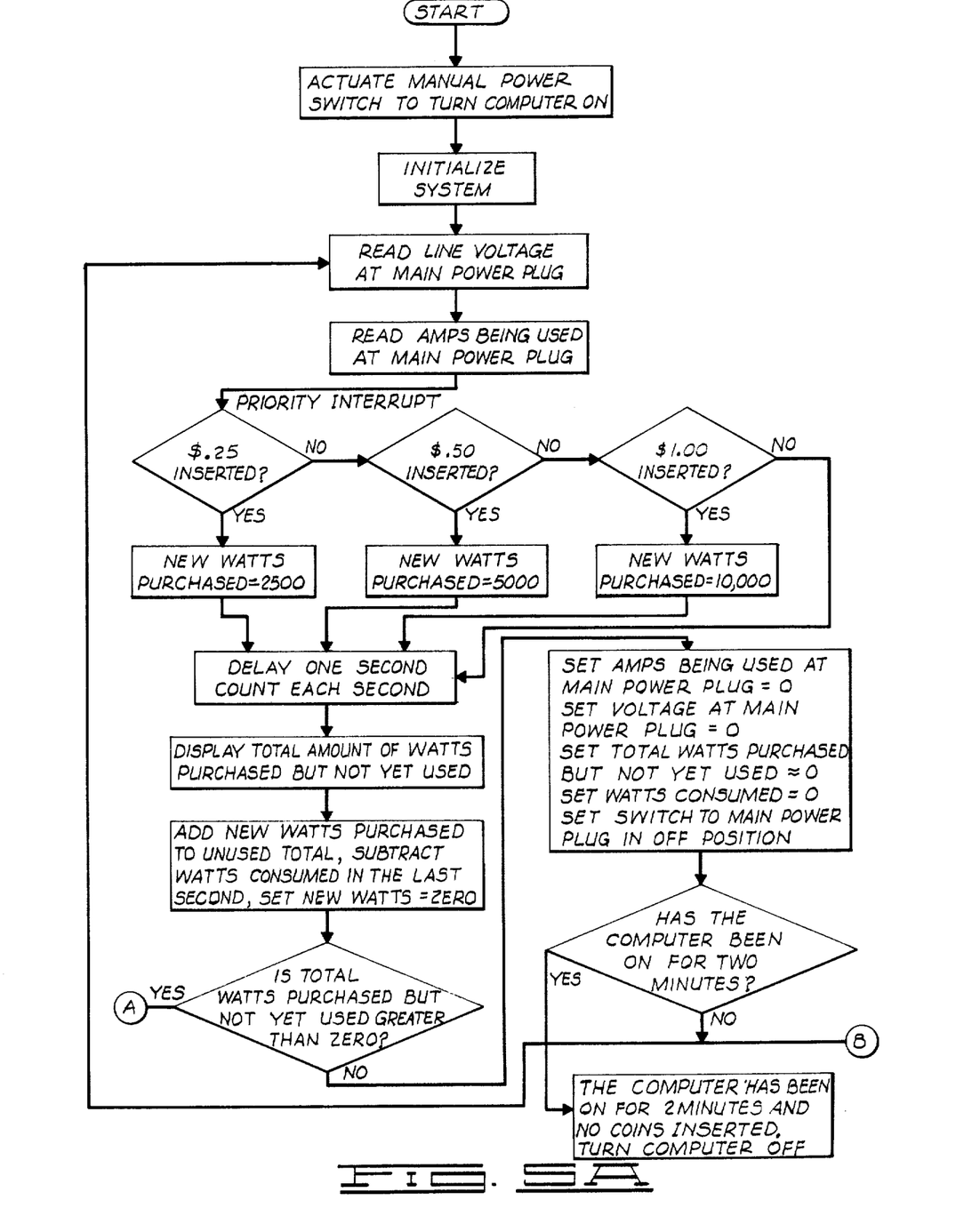

With reference to FIGS. 2 and 3, the apparatus 2 illustrated in FIG. 1 will be more particularly described. FIG. 2 indicates that the present invention includes activation means 36 for selecting a quantity of power to be delivered from the primary power source to the energy storage device which is to be recharged. The apparatus 2 further includes the outlet means 14 previously described with reference to FIG. 1. The outlet means 14 is switchably connected to the primary power source and is used for electrically connecting the storage device to the apparatus 2. The present invention further includes electronic control means 38, responsive to the activation means 36, for controlling the switchable connection of the outlet means 14 with the primary power source. A display means 40 having the visual display 28 is also included in the apparatus 2.

FIG. 3 shows that the activation means 36 includes a manual start switch means 42 which includes the manual start button 20 shown in FIG. 1. The manual start switch 42 is actuated by the vehicle user, or other person desiring to use the recharging apparatus, when the vehicle user desires to initiate the operation of the recharging apparatus 2. By appropriately manipulating the start switch 42, which is of an appropriate type as known in the art, the vehicle owner energizes the control means 38 as will be subsequently described. The actuation of the manual switch 42 and the consequent energization of the electronic control means 38 commence a predetermined time period during which an appropriate medium of exchange must be received by the apparatus 2 to prevent the automatic deenergization of the apparatus.

FIG. 3 further shows that the activation means 36 includes receiving means 44 for receiving a predetermined medium of exchange so that a predetermined quantity of power to be delivered to the device connected to the outlet means 14 can be purchased by the vehicle owner, or other apparatus 2 user. In particular, the medium of exchange receiving means 44 is a money or token receieving mechanism of the type as is known in the art for accepting a predetermined denomination of currency, such as a coin or other suitable token. For example, the money receiving mechanism may be of the type known as Coinco Acceptors. So that the vehicle owner can retrieve improperly inserted coins from the mechanism, the money receiving mechanism includes, in the preferred embodiment, coin return means including the coin return button 22 and slot 24 illustrated in FIG. 1. This means is operated in the known manner to return a coin to the vehicle owner through the coin return slot 24 formed in the housing 12.

Upon receiving an appropriate medium of exchange, such as a coin, the activation means 36 generates a respective electrical signal corresponding to the respective denomination of the medium of exchange received by the activation means (particularly, by the receiving means 44). The respective electrical signal is generated, for example, by means of a switch which closes and thereby completes an electrical circuit in response to the respective denomination of the medium of exchange being received.

The outlet means 14 is shown in FIG. 3 to include interface means 32 for electrically coupling the recharging apparatus 2 to a device for receiving the quantity of power purchased by the appropriate medium of exchange being received by the activation means. In the preferred embodiment the interface means 32 includes a double-terminal socket 48 for receiving a double-pronged plug (not shown) connected to the device to be recharged.

FIG. 1 indicates a first terminal 50 of the socket 48 is connected to the power line 16 communicating with the primary power source. A second terminal 52 of the socket 48 is connected to switch means 30 which forms a part of the outlet means 14 and connects the interface means 32 to the primary power source. In the preferred embodiment the switch means 30 includes a relay 56 having one end of its switch element connected to the second terminal 52 and having a second end of its switch element connected to the power line 18 communicating with the primary power source. When the relay 56 is actuated so that the relay switch element closes, the socket terminals 50 and 52 have the primary source potential, or voltage, thereacross. When the plug from the device to be recharged is inserted into the socket 48, power is then provided to the device.

To control the operation of the relay 56 in the outlet means 14, the present invention includes the electronic control means 38, represented in FIG. 2 as the control unit 38. The control unit 38 includes means, responsive to the receiving means 44, and in particular to the respective electrical signals generated thereby in response to the receipt of an appropriate medium of exchange, for making the switchable connection of the outlet means 14 with the primary power source so that the purchased predetermined quantity of power is delivered to the storage device connected to the outlet means 14. More particularly, the electronic control means 38 includes electronic computer means 60 having a processing unit 62, such as a microprocessor as is known in the art, and an electronic memory 64, such as read only memory (ROM) and/or random access memory (RAM) as is also known in the art.

The processing unit 62, under control of a program stored in the memory, responds to the actuation of the manual switch means 42 and the money receiving mechanism to energize the relay 56, and thereby close the relay switch to energize the outlet socket 48 when the appropriate medium of exchange, such as a predetermined denomination of money, is inserted into the receiving mechanism. More particularly, the computer 60 responds to the electrical signals from the activation means 36. This response occurs through a priority interrupt electronic circuit 66 included within the control unit 38. The priority interrupt circuit is of the type known in the art, such as a μPB8214C priority interrupt controller integrated circuit. The interrupt circuit 66 responds to the electrical signals generated in response to different denominations of the medium of exchange (such as quarters, half dollars and dollars, for example) being inserted into the receiving mechanism of the activation means 36. For example, when a quarter is inserted into the receiving mechanism, a respective electrical signal is sent to the priority interrupt circuit 66 which provides a first interrupt to the computer 60 to indicate a respective predetermined denomination of medium of exchange (i.e., a quarter for this example) has been deposited in the apparatus 2 to purchase a predetermined quantity of power. The processing unit 62 thus determines the predetermined quantity of power corresponding to the respective priority signal that is to be dispensed through the outlet means 14. When a half dollar coin or a one dollar coin, for example, is inserted into the receiving mechanism, the priority interrupt circuit 66 generates a second or third level priority signal, respectively, which indicates to the computer 60 that different, respective predetermined quantities of power are to be dispensed because of the different denomination of coin deposited in the apparatus 2.

FIG. 3 further shows the control unit 38 includes latch means 68 of a suitable type as is known in the art. The latch means 68 receives the electrical signal generated upon the actuation of the manual switch means 42 and electronically stores the logic level indicated thereby. This logic level is communicated to the processing means 62 to energize it when the logic level is appropriate. When the processing unit 62 determines that it is to be deenergized, as subsequently discussed, it sends to the latch means 68 an appropriate clearing signal which removes the energization logic level signal from the latch means and thereby automatically turns the apparatus 2 off.

The control unit 38 further includes monitoring means for monitoring the voltage and current in the outlet means 14. The monitoring means includes current monitoring means 70 for determining the amount of current passing through the outlet means 14 during a predetermined time period. The monitoring means also includes voltage monitoring means 72 for detecting a voltage level in the outlet means 14. The current monitoring means 70 and the voltage monitoring means 72 are of suitable types as known in the art. For example, the current monitoring means 70 may include an ammeter and the voltage monitoring means 72 may include a voltmeter, each having suitable interface means for interfacing with the outlet means 14 and the processing unit 62.

The electronic computer means 60 includes current stopping means, responsive to the current monitoring means 70, for disconnecting the switchable connection between the outlet means 14 and the primary power source when the current monitoring means 70 determines the current flowing through the outlet means 14 during a predetermined time period is not greater than (i.e., is less than or equal to) a predetermined current value. For example, the predetermined value can be zero amperes so that when no current is detected flowing through the outlet means 14 for the predetermined period, such as one second, the computer 60 causes the switch means 30 to electrically disconnect the socket 48 from the primary power source so that no power is transferred to the device connected to the socket. Thus, this prevents power thefts by ones, subsequent to the apparatus user who purchased the power, who attempt to replace the originally connected rechargeable device with their own device.

For example, when a first electric vehicle has been connected to the socket 48 of the outlet means 14 and an amount of recharging power has been purchased by the owner of the first vehicle, the relayer 56 of the switch means 30 is closed and a current is provided to the vehicle until the purchased power has been dispensed. Should the current cease flowing (i.e., have a value of zero amperes) prior to the full dispensation of the purchased quantity, the computer detects this via the current monitoring means 70 and is programmed such that it presumes the first vehicle has been disconnected (which would cause the current to cease flowing through the outlet means 14) and a second vehicle is likely to be connected in an attempt to steal the remaining power which was purchased by the first vehicle's owner. In response to the detection of this condition of abnormal current flow, the counter 60 causes the socket 48 to be electrically disconnected from the primary power source.

The computer further includes current passing means, responsive to the voltage monitoring means 72, for preventing the current stopping means from controlling the switch means 54 when the detected voltage level is not greater than a predetermined voltage level. This current stopping means overriding function is desirable because during such natural occurrences as storms, for example, the primary power source may be affected so that little or no power, and thus current less than or equal to the predetermined current level, is provided to the apparatus even though the rechargeable device has not been disconnected from the outlet means 14. Therefore, when the voltage is not greater than a predetermined level, no electrical disconnection of the outlet means 14 from the primary power source occurs because the computer 60 is programmed to presume that this condition signifies a situation other than an attempted theft, regardless of the magnitude of the current flowing through the outlet means.

To turn the apparatus 2 off at the completion of the dispensing of the purchased amount of power, the computer means 60 includes means for determining the difference between the quantity of power purchased and the quantity of power delivered to the device connected to the outlet means and means for operating the switch means to electrically disconnect the primary power source from the interface means 32 of the outlet means 14 when the difference is not greater than (i.e., equal to or less than) a predetermined value. The computer means 60 further includes means for deenergizing the computer means when no quantity of power is purchased, as detected by no appropriate medium of exchange being received by the apparatus 2, within the predetermined time period commenced when the manual switch start means 42 energizes the apparatus 2 or when the difference between the purchased power and the dispensed power is less than or equal to the predetermined value or when the anti-theft means detects the conditions of an attempted power theft. This deenergizing means operates by having the computer 60 send the appropriate clearing signal to the latch means 68 as previously discussed.

The apparatus 2 further comprises the display means 40 for displaying the difference between the quantity of power purchased and the quantity of power delivered and includes visual display elements 28 such as light emitting diodes or other suitable elements.

Figure 4:
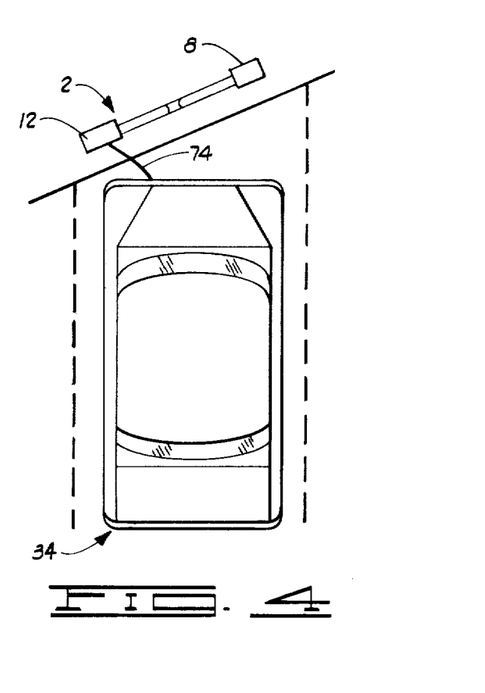
FIG. 4 is a schematic plan view of an electric vehicle connected to the apparatus of the present invention.
Figure 5B:
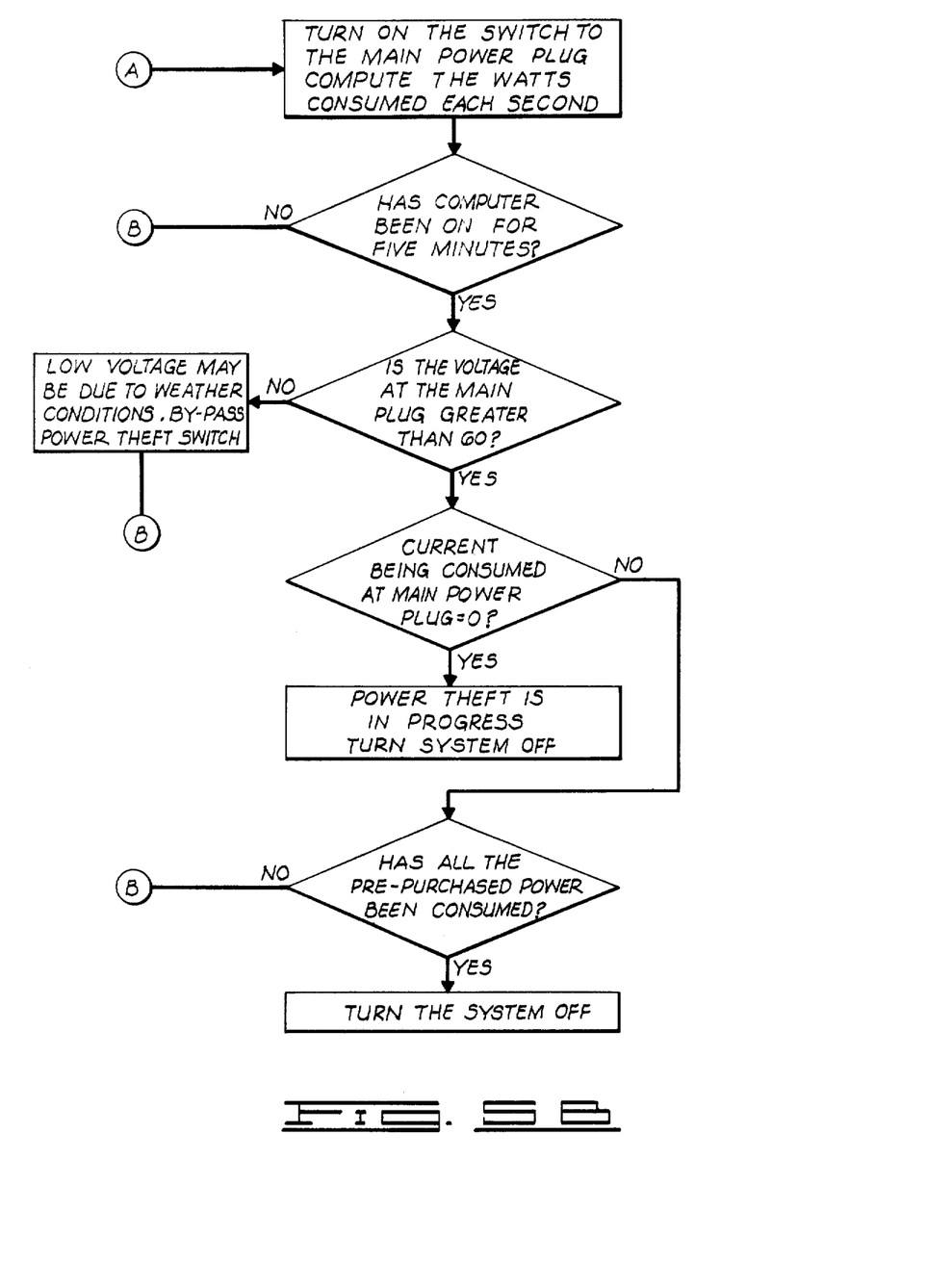

With reference primarily to FIGS. 1, 4 and 5, the operation of the present invention will be described. Initially, as shown in FIG. 4 the storage device, such as the batteries in the electric vehicle 34, are connected to the socket 48 located on the support structure 6. This connection is made by a suitable cord 74 which accompanies the electric vehicle 34.

Once the vehicle 34 is appropriately connected, the vehicle owner depresses the manual start button 20 to energize the apparatus 2. In the preferred embodiment program disclosed in FIG. 5, once the manual button 20 is depressed and the apparatus 2 is actuated, the vehicle owner has two minutes within which to connect the vehicle 34 to the socket 48 (if the connection has not already been made) and to deposit the appropriate medium of exchange to purchase a selectable quantity of power to be dispensed to the connected electrical vehicle. If the vehicle 34 is not connected and the coins are not deposited within the two-minute time period, the program instructs the computer 60 to turn itself off. This is accomplished by placing the appropriate logic level signal on the output of the processor 62 connected to the latch means 68 as shown in FIG. 3. The latch means 68 is thereby controlled to place a deactivating logic level signal on its output line connected to the power-on input of the processing means 62.

Once the apparatus 2 has been energized by the manual start means 42 and the vehicle 34 has been connected to the socket 48, the vehicle owner then inserts the appropriate coin or coins into the coin insertion slot 26 formed in the housing 12, as shown in FIG. 1, within the two-minute time period to prevent the automatic deenergization of the apparatus. As the coins are received, respective interrupt signals are provided to the computer 60 so that the appropriate quantity of purchased power is entered. It is to be noted that upon energization, the computer has initialized its registers so that the appropriate initial values are entered.

Upon receipt of the appropriate medium of exchange, such as the previously mentioned coins, the computer calculates the total amount of power purchased and subtracts therefrom the total amount of power dispensed, if any, which has been determined from the monitored voltages and currents or from a power sensing means which may be included in the apparatus 2. This difference is then displayed by the display means 40.

If the difference between the purchased and dispensed quantities its greater than zero, thereby indicating that power is still to be dispensed to the connected vehicle, the switch 30 in the outlet means 14 is closed, or maintained in a closed position if previously closed, or otherwise operated so that the socket 48 is connected to the primary power source.

FIG. 5 next shows that the computer 60, under control of the depicted program, determines whether it has been on for five minutes; if not, it continues to cycle and output power regardless of the status of the monitored voltages and currents. Therefore, within the first five minutes a power theft can occur without being detected by the preferred embodiment program depicted in FIG. 5. However, it is to be noted that the program can be modified to detect an attempted power theft even during this time period.

If five minutes have elapsed from the time the apparatus was turned on, the computer 60 determines whether the voltage in the outlet means 14 is less than or equal to a predetermined voltage value, such as sixty volts. If the voltage is below or equal to the predetermined voltage value, the computer cycles through its normal routine because this low voltage indicates a problem which is presumed not to be related to an attempted power theft. However, if the voltage is greater than the predetermined voltage level, the computer 60 determines the amount of current passing through the outlet means 14.

If the current passing through the outlet means 14 is not greater than a predetermined current value, such as zero amperes, the apparatus is turned off because this determination indicates that the initially connected vehicle has been disconnected from the outlet means 14 and a second vehicle is possibly to be connected thereto in an attempt to improperly consume the power purchased for the initially connected vehicle.

If the current passing through the outlet means 14 is greater than the predetermined value, the computer 60 cycles through the appropriate program steps until the pre-purchased power has been consumed. Upon the consumption of the pre-purchased power, the computer 60 turns the apparatus off by de-energizing the relay 56 of the switch means 30 and by de-energizing itself by sending the appropriate command to the latch means 68.

Thus, the present invention of an apparatus and method for recharging an energy storage device from a primary power source with a selectable quantity of power is well adapted to carry out the objects and attain the ends and advantages mentioned above as well as those inherent therein. While a preferred embodiment of the invention has been described for the purpose of this disclosure, numerous changes in the construction and arrangement of parts can be made by those skilled in the art, which changes are encompassed within the spirit of this invention as defined by the appended claims.

What is claimed is:

1. An apparatus for recharging an energy storage device from a primary power source with a selectable quantity of power, comprising:
   activation means for selecting a quantity of power to be delivered from said primary power source to said storage device;
   outlet means, switchably connected to said primary source, for electrically connecting said apparatus and said storage device; and
   electronic control means, responsive to said activation means, for controlling the switchable connection of said outlet means with said primary power source, said electronic control means including:
   current monitoring means for determining the amount of current passing through said outlet means during a predetermined time period; and
   current stopping means, responsive to said current monitoring means, for disconnecting the switchable connection between said outlet means and said primary power source when said current monitoring means determines the current flowing through said outlet means during the predetermined time period is not greater than a predetermined value.

2. An apparatus as defined in claim 1, wherein said electronic control means further includes:
   voltage monitoring means for detecting a voltage level in said outlet means; and
   current passing means, responsive to said voltage monitoring means, for preventing said current stopping means from disconnecting the switchable connection if the detected voltage level is not greater than a predetermined level.

3. An apparatus as defined in claim 2, wherein:
   said activation means includes receiving means for receiving a predetermined medium of exchange so that a predetermined quantity of power to be delivered to said storage device is purchased when an appropriate medium of exchange is received by said receiving means; and
   said electronic control means further includes means, responsive to said medium of exchange accepted by said receiving means, for making the switchable connection of said outlet means with said primary power source so that the purchased predetermined quantity of power is delivered to said storage device when said storage device is connected to said outlet means.

4. An apparatus as defined in claim 3, wherein:
   said electronic control means further includes means for determining the difference between the predetermined quantity of power purchased and the quantity of power delivered to said storage device; and
   said apparatus further comprises display means for displaying the determined difference.

5. An apparatus as defined in claim 3, wherein:
   said activation means further includes start means for energizing said electronic control means; and
   said electronic control means further includes means for deenergizing said electronic control means when no quantity of power is selected by said activation means within a predetermined time period after said start means energizes said electronic control means.

6. An apparatus from which a selectable quantity of electrical power can be purchased, comprising:
   token receiving means for accepting at least one token so that a selectable quantity of power is thereby purchased;
   outlet means, including:
   interface means for electrically coupling said apparatus to a device for receiving the purchased quantity of power; and
   switch means for electrically connecting said interface means to a primary power source;
   current monitoring means for monitoring the current passing through said interface means; and
   electronic computer means, responsive to said token receiving means, for controlling said switch means so that said primary power source is electrically connected to said interface means when a selectable quantity of power is purchased, said electronic computer means including:
   calculating means, responsive to said current monitoring means, for calculating the amount of current passing through said interface means during a predetermined time period; and
   disconnecting means, responsive to said calculating means, for controlling said switch means to electrically disconnect said primary power source from said interface means when the amount of current passing through said interface means during the predetermined time period is not greater than a predetermined value so that no power is transferred to the device connected to said interface means without the receipt of an appropriate token by said token receiving means.

7. An apparatus as defined in claim 6, wherein:
   said apparatus further comprises voltage monitoring means for monitoring a voltage level in said interface means; and
   said electronic computer means further includes:
   means, responsive to said voltage monitoring means, for detecting when the monitored voltage is not greater than a predetermined level; and
   means, responsive to said detecting means, for preventing said disconnecting means from controlling said switch means when the voltage is determined to be below the predetermined level.

8. An apparatus as defined in claim 6, wherein said token receiving means includes means for generating a respective predetermined priority interrupt signal in response to the receipt by said token receiving means of a token having a respective denomination.

9. An apparatus as defined in claim 6, wherein:
said apparatus further comprises start means for energizing said electronic computer means; and
said electronic computer means includes means for de-energizing said electronic computer means when said electronic computer means detects that no token has been accepted by said token receiving means within a predetermined time period after said start means energizes said electronic computer means.

10. An apparatus from which a selectable quantity of electrical power can be purchased, comprising:
token receiving means for accepting at least one token so that a selectable quantity of power is thereby purchased;
outlet means, including:
interface means for electrically coupling said apparatus to a device for receiving the purchased quantity of power; and
switch means for electrically connecting said interface means to a primary power source;
current monitoring means for monitoring the current passing through said interface means; and
electronic computer means, responsive to said token receiving means, for controlling said switch means so that said primary power source is electrically connected to said interface means when a selectable quantity of power is purchased, said electronic computer means including:
means for determining the difference between the quantity of power purchased and the quantity of power delivered to the device connected to said interface means;
means for operating said switch means to electrically disconnect said primary power source from said interface means when said difference is not greater than a predetermined value;
calculating means, responsive to said current monitoring means, for calculating the amount of current passing through said interface means during a predetermined time period; and
disconnecting means, responsive to said calculating means, for controlling said switch means to electrically disconnect said primary power source from said interface means when the amount of current passing through said interface means during the predetermined time period is not greater than a predetermined value so that no power is transferred to the device connected to said interface means without the receipt of an appropriate token by said token receiving means.

11. An apparatus as defined in claim 10, wherein:
said apparatus further comprises voltage monitoring means for detecting a voltage level in said interface means; and
said electronic computer means further includes:
means, responsive to said voltage monitoring means, for detecting when the monitored voltage is not greater than a predetermined level; and
means for preventing said disconnecting means from controlling said switch means when the voltage is determined to be below the predetermined level.

12. An apparatus as defined in claim 11, further comprising display means for displaying the difference between the quantity of power purchased and the quantity of power delivered.

13. An apparatus as defined in claim 12, wherein said token receiving means includes means for generating a respective predetermined priority interrupt signal in response to the receipt by said token receiving means of a token having a respective denomination.

14. An apparatus as defined in claim 13, wherein:
said apparatus further comprises start means for energizing said electronic computer means; and
said electronic computer means includes means for deenergizing said electronic computer means when said electronic computer means detects that no token has been accepted by said token receiving means within a predetermined time period after said start means energizes said electronic computer means.

15. An electrical power vending apparatus for dispensing prepurchased quantities of power to a device connected to said apparatus comprising:
activation means for activating said apparatus, said activation means including money receiving means for receiving money and generating a respective electrical signal corresponding to a respective denomination of money received by said activation means;
electrical coupling means for providing an electrical connection between said apparatus and said device;
switch means for electrically connecting said coupling means with a primary power source;
current monitoring means for monitoring current passing through said coupling means and for generating an electrical signal proportional thereto;
voltage monitoring means for monitoring voltage in said coupling means and for generating an electrical signal proportional thereto; and
computer means, responsive to the electrical signals generated by said activation means, said current monitoring means and said voltage monitoring means, for controlling said switch means so that said switch means electrically connects said coupling means and said primary power source to dispense power in a quantity determined by the denomination of money received by said activation means when said device is connected to said coupling means and when the monitored current passing through said coupling means is greater than a predetermined current value or the monitored voltage in said coupling means is not greater than a predetermined voltage value.

16. An apparatus as defined in claim 15, wherein:
said activation means includes start means for energizing said computer means; and
said computer means includes means for deenergizing said computer means when said computer means detects no electrical signal from said money receiving means within a predetermined time period after said start means energizes said computer means.

17. A method of dispensing electrical power from an outlet in prepurchased quantities, comprising the steps of:
receiving a token;
determining the quantity of power purchase by said token;
calculating the quantity of power dispensed from said outlet;

determining the difference between the quantity of power purchased and the quantity of power dispensed;

electrically connecting said outlet to a primary power source when the calculated difference is greater than a predetermined value;

disconnecting said outlet from said primary power source when the difference is less than or equal to the predetermined value;

monitoring a voltage in said outlet;

monitoring the current passing through said outlet during a predetermined time period; and disconnecting said outlet from said primary power source when the current passing through said outlet during the predetermined time period is not greater than a predetermined current value and the voltage in the outlet is greater than a predetermined voltage value.

* * * * *